(12) United States Patent  
Wang et al.

(10) Patent No.: US 7,274,572 B2
(45) Date of Patent: Sep. 25, 2007

(54) SUPPORTING PLATE

(75) Inventors: Frank Wang, Taipei (TW); Yi-Lun Cheng, Taipei (TW); Chih-Kai Yang, Taipei (TW)

(73) Assignee: Inventec Corporation (TW)

( * ) Notice: Subject to any disclaimer, the term of this patent is extended or adjusted under 35 U.S.C. 154(b) by 188 days.

(21) Appl. No.: 11/114,374

(22) Filed: Apr. 26, 2005

(65) Prior Publication Data

US 2006/0238976 A1 Oct. 26, 2006

(51) Int. Cl.
H05K 7/20 (2006.01)

(52) U.S. Cl. .................. 361/719; 361/704; 361/715; 165/80.3; 165/185; 174/16.3; 174/252; 257/718; 257/719

(58) Field of Classification Search ........... 361/687, 361/688, 690–695, 697, 702–709, 714–719, 361/735, 741, 752, 756, 760, 764, 767, 768, 361/785, 789, 799, 802, 803, 816, 818; 257/706–727; 165/80.2, 80.3, 80.4, 80.5, 165, 185; 174/16.3, 174/252; 29/739, 740, 890.032; 439/66, 439/71, 74, 86–91; 248/505, 518
See application file for complete search history.

(56) References Cited

U.S. PATENT DOCUMENTS 5,712,762 A * 1/1998 Webb ..................... 361/687
5,808,236 A * 9/1998 Brezina et al. ............ 174/16.3
5,923,530 A * 7/1999 Murayama et al. ......... 361/687
6,356,445 B1 * 3/2002 Mochzuki et al. .......... 361/697
6,377,463 B1 * 4/2002 Shah ......................... 361/720
6,952,348 B2 * 10/2005 Wu ............................ 361/719
7,126,826 B1 * 10/2006 Sorensen et al. .......... 361/719
7,142,427 B2 * 11/2006 Reents ....................... 361/704
7,239,520 B2 * 7/2007 Barsun ...................... 361/719

* cited by examiner

Primary Examiner—Michael Datskovskiy
(74) Attorney, Agent, or Firm—Venable LLP; Raymond J. Ho

(57) ABSTRACT

A supporting plate includes a metal plate and is utilized to support a heat sink module in an electronic device. The heat sink module has a thermal pad, and the electronic device has a first heat generating element and a second heat generating element. In addition, the heat sink module is contacted to the first heat generating element for conducting heat generated by the first heat generating element to the thermal pad. Moreover, the metal plate has a first concave portion and a second concave portion. The first concave portion is contacted to the thermal pad, and the second concave portion is contacted to the second heat generating element for conducting heat generated by the second heat generating element to the heat sink.

8 Claims, 5 Drawing Sheets

SUPPORTING PLATE

The present invention relates to a supporting plate for heat sink module, applied to a notebook computer. It is not only can support a thermal pad of heat sink module, but also can conduct the heat generated by a second heat generating element to the heat sink module.

Most information technology electronic devices, such as notebook computers, their electronic components will often generate large quantities of heat during operation; therefore, the working temperature continues to be rising during electronic components operation. However, there is a temperature limit for each electronic component. If the electronic component of a computer does not dissipate the heat appropriately, and the heat is over a temperature that the electronic component can stand, it will have an unstable operation occurred in the computer and cause the computer to stop or shut down. As the operation speed continues rising of the electronic components, heat is also increasing. Therefore, the design of a heat sink module becomes a very important topic.

Usually, a heat sink module is installed on a heat generating element of an electronic device, and a thermal pad of the heat sink module must closely contact to the surface of the heat generating element for a thermal conductive purpose. For the general notebook computer, Central Processing Unit, North Bridge, South Bridge and display chip are the key elements of the heat generating, therefore, those chips are often operated with large quantities of data, resulted in large quantities of heat occurred.

Customers demand more and more efficiency and capacity of upgrading to the display card; hence, the design of display card is tend to be detachable which likes an interface card of a desktop computer, not to fix to the mother board any more. Therefore, the display card will not be installed in the same plane with Central Processing Unit, South Bridge and North Bridge. As the notebook computer is small in size and light in weight, to shrink the installed space of the display card, the design of the display card in insert way is different from the desktop computer. In the notebook computer, the display card is horizontally inserted to a slot on the motherboard of the notebook computer, but the display card of a desktop computer is vertical inserted to a slot on the motherboard of the desktop computer. Therefore, how to dissipate the heat generated from the display chip on the display card in a notebook computer becomes a topic and need to be overcome.

An object of the present invention is to provide a supporting plate. It is not only can support a thermal pad of a heat sink module, but also can conduct heat from a second heat generating element to the heat sink module. As the supporting plate applies in the notebook computer, it is not only can dissipate the heat generated from a display chip, but also can conduct the heat generated from a second heat generating element, such as a North Bridge, to the heat sink module by a second concave portion of the supporting plate.

To reach the aforementioned object, the present invention provides a supporting plate, which comprises a metal plate. The metal plate has a first concave portion and a second concave portion. The first concave portion is located in the metal plate where corresponds to a thermal pad of a heat sink module. The first concave portion is used to accommodate a thermal pad of the heat sink module and to hold the thermal pad. In addition, there is an opening under the first concave portion, and the opening can accommodate a heat pipe of the heat sink module. The second concave portion is located in the metal plate where corresponds to a second heat generating element of an electronic device. The second concave portion is utilized to contact with a second heat generating element for a thermal conductive purpose. The first concave portion and the second concave portion are formed in a punch manner.

By practicing this present invention, the first concave portion can accommodate and hold a thermal pad of a heat sink module and also contact with a first heat generating element of an interface card for a thermal conductive purpose. And by the second concave portion to contact with a second heat generating element of a mother board can also have a thermal conductive purpose. Therefore, the supporting plate has the dual functions to support a thermal pad and to contact with a heat generating element for a thermal conductive purpose. As the heat sink module is disposed on between the first and second heat generating elements where the first and second heat generating elements are face by face to each other, by this arrangement can save space in the notebook computer. The heat conducting path of the heat generating elements are proceeding between the interface card and the mother board, so that the temperature will not spread directly and will not have a high temperature occurred on the surface of the product.

Thus, the implementation of this present invention brings forth at least the following desirable results:

1. The supporting plate can support the thermal pad of a heat sink module.
2. The supporting plate can conduct heat from a second heat generating element.

The invention will become more fully understood from the detailed description given below for illustration only, and thus are not limitative of the present invention, and wherein.

Figure 1:
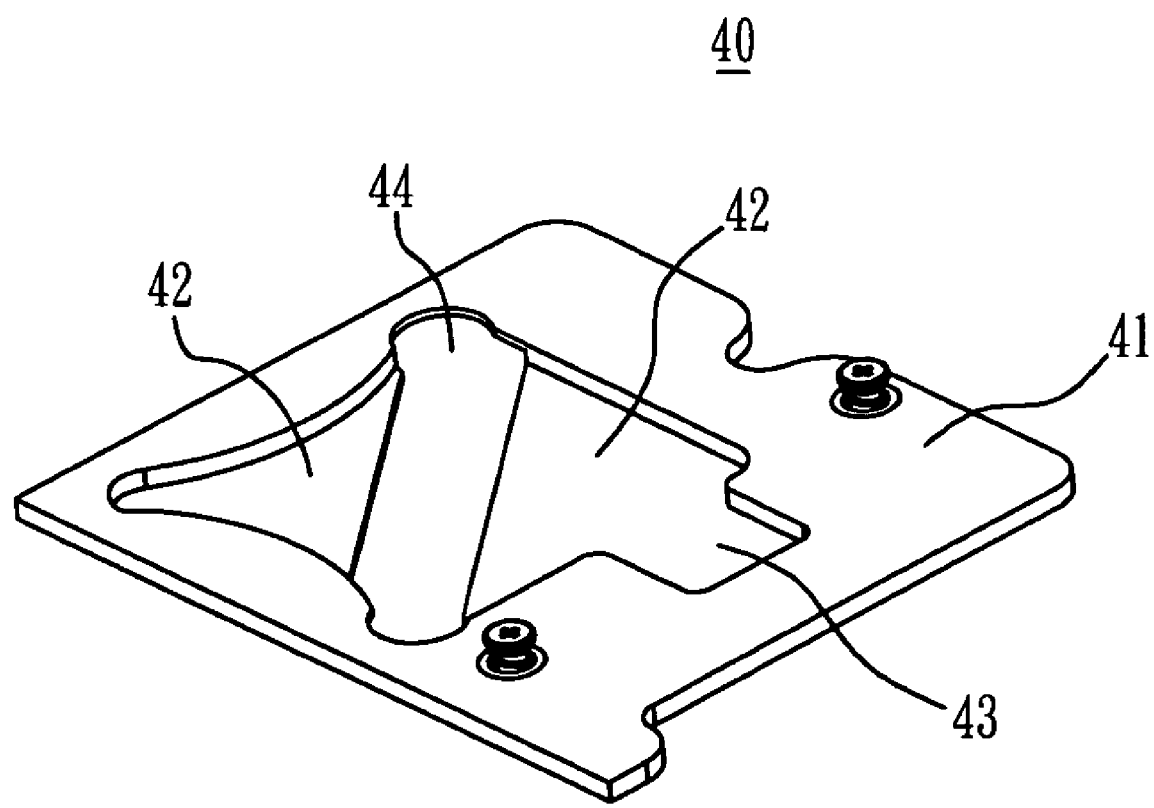
FIG. 1 shows a perspective view of one embodiment of the present invention of the supporting plate.

Referring to FIG. 1, a perspective view of one embodiment of the present invention is shown. The supporting plate 40 is utilized to accommodate and hold the thermal pad 22 of the heat sink module and contact with the second heat generating element 62 in an electronic device for a thermal conductive purpose, and the supporting plate 40 comprises a metal plate 41. The metal plate has a first concave portion 42 and a second concave portion 43. The electronic device can be a notebook computer, a media player, a desktop computer, or a server.

The metal plate 41 is a well thermal conductive plate, made of stainless steel. By a metal material extension character, it can be made a first concave portion 42 and a second concave portion 43 into a whole in a punch manner.

However, if the supporting plate 40 is only utilized to contact with the second heat generating element 62 for a thermal conductive purpose, which is via the bottom of the second concave portion 43 to contact with the surface of the second heat generating element 62 for a thermal conductive purpose. Therefore, the first concave portion 42 does not need an opening 44.

The supporting plate 40 of this embodiment is utilized to support the thermal pad 22 of a heat sink module and contact with a second heat generating element 62 for a thermal conductive purpose. The location of the first concave portion 42 is located in the metal plate 41 where corresponds to the thermal pad 22 of the heat sink module. And the first concave portion 42 is used to accommodate and hold the thermal pad 22 for supporting. After that, the thermal pad 22 can closely contact with the first heat generating element 51 on an interface card 50 in a thermal conductive manner. The first heat generating element 51 particularly is a display chip or a graphic chip.

Enable to closely contact with the thermal pad 22 and the first heat generating element 51 on the interface card 50, the deepness of the first concave portion 42 is equal to the thickness of the thermal pad 22. Therefore, the top end of the thermal pad 22 and the top end of the first concave portion 42 are at the same height, then the display chip or the graphic chip can smoothly contact with the thermal pad 22. The shape and the area of the first concave portion 42 are formed to accommodate the thermal pad 22. Enable to smoothly connect a heat pipe 23 with the thermal pad 22, the bottom of the first concave portion 42 has an opening 44, and the opening 44 is used to accommodate the heat pipe 23.

The second concave portion 43 is located in the metal plate 41 where corresponds to the second heat generating element 62 of the electronic device. The second heat generating element 62 may be a Central Process Unit, a South Bridge, a North Bridge or a display chip. Enable to make the second concave portion 43 can closely contact with second heat generating element 62 for a thermal conductive purpose, the deepness of the second concave portion 43, that is the bottom of the second concave portion 43, must be designed to closely contact to the surface of the second heat generating element 62 for a thermal conductive purpose.

Figure 2:
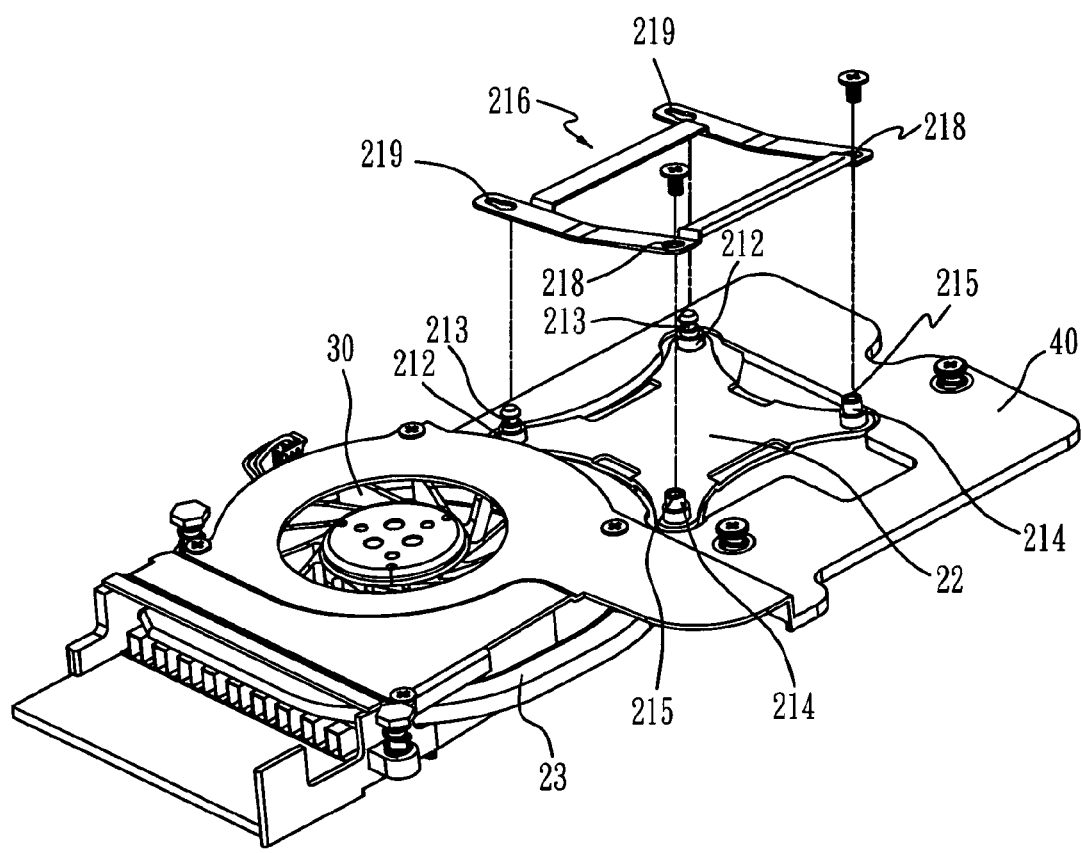
FIG. 2 shows a perspective view of one embodiment of the present invention of the supporting plate and a heat sink module.
Figure 3:
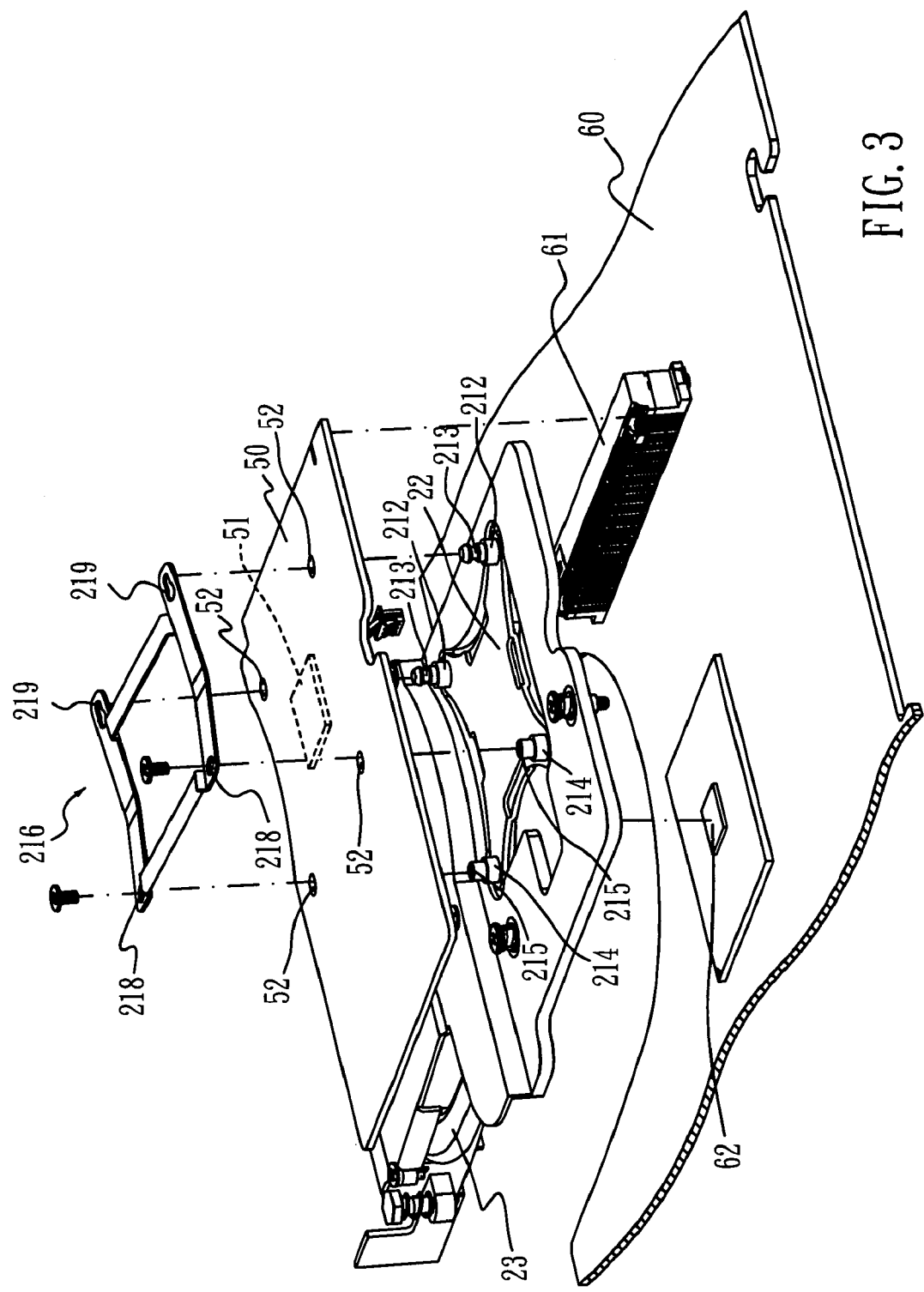
FIG. 3 shows an exploded perspective view of one embodiment of the present invention of the supporting plate, a display card and a motherboard.
Figure 4:
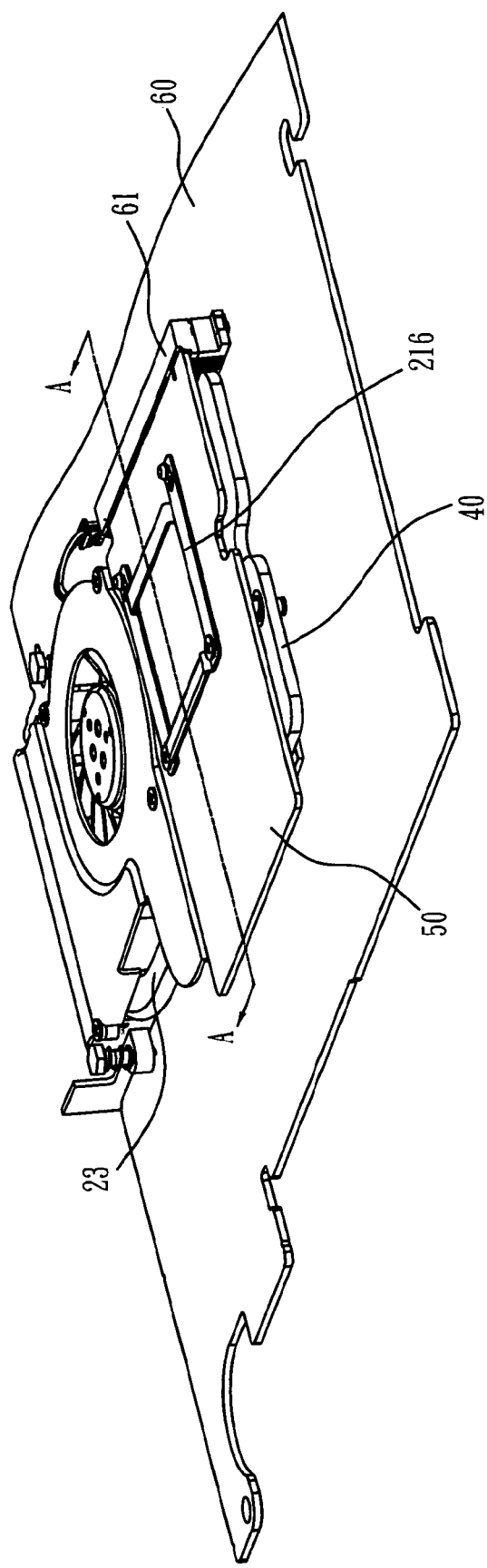
FIG. 4 shows a combined perspective view of one embodiment of the supporting plate, a display card and a motherboard.
Figure 5:
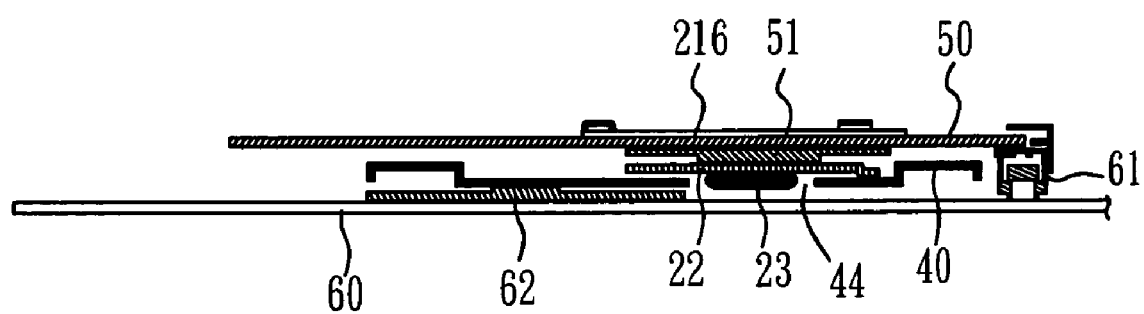
FIG. 5 shows a cross-section view taken along line A-A of FIG. 4.

Referring to FIG. 2, a perspective view of one embodiment of the supporting plate 40 and a heat sink module is shown. Referring to FIG. 3, an exploded perspective view of one embodiment of the supporting plate 40, a display card and a motherboard is shown. Referring to FIG. 4, a combined perspective view of one embodiment of the supporting plate 40, a display card and a motherboard is shown. Referring to FIG. 5, a cross-sectional view taken along line A-A of FIG. 4 is shown. The supporting plate 40 not only can connect with a mother board 60 and the second heat generating element 62 on the mother board 60 for a thermal conductive purpose, but also can support a thermal pad 22 which can contact with an interface card 50 to dissipate the heat from the first heat generating element 51 (i.e. display chip or graphic chip) of the interface card 50. The interface card 50 is a display card (i.e. VGA card) or a graphic card (i.e. MXM card).

When the supporting plate 40 is being utilized, firstly, the supporting plate 40 is connected with a heat sink module by screwing the supporting plate 40 on the mother board 60. At the time, the second concave portion 43 of the supporting plate 40 is smoothly contacted to the second heat generating element 62 on the motherboard 60. Wherein the second heat generating element 62 particularly is North Bridge. The bottom of the thermal pad 22 is closely contacted to the first concave portion 42 of the supporting plate 40. Therefore, the heat of the North Bridge can be conducted from the second concave portion 43 to the first concave portion 42 and can further be conducted from the first concave portion 42 to the thermal pad 22 to dissipate the heat by the heat sink module.

Next, the interface card 50 is via the slot 61 to contact with the motherboard 60. By the hole 52 of the interface card 50, the buckle pillar 212 and the screw pillar 214 of the thermal pad 22 can be passed through the hole 52. Then put a buckle hole 219 of the clipping plate 216 to hold the ring groove 213 of the buckle pillar 212, and put the fixing hole 218 of the clipping plate 216 to aim at the screw hole 215 of the screw pillar 214; finally, using screws to screw the fixing hole 218 and the screw hole 215. Therefore, the thermal pad 22 disposed in the first concave portion 42 can closely contact with a display chip or a graphic chip on the interface card 50, and can dissipate the heat generated by the display chip or the graphic chip. When the supporting plate 40 being practiced, both the first heat generating element 51 in the interface card 50 and the second heat generating element 62 in the motherboard 60 can be thermally conducted at the same time, and by heat sink module to dissipate the heats.

Those described above are only the preferred embodiments of the present invention, and it is no intended to limit the scope of the present invention. And equivalent variation and modification according to the appended claims of the present invention would not depart from the spirit of the present invention and is to be included within the scope of the present invention.

What is claimed is:

1. A supporting plate, which is utilized to support a heat sink module in an electronic device, said heat sink module having a thermal pad, said electronic device having a first heat generating element and a second heat generating element, said heat sink module contacting said first heat generating element to conduct heat generated by said first heat generating element to said thermal pad, said supporting plate comprising:

a metal plate, having a first concave portion and a second concave portion, said first concave portion contacting said thermal pad, said second concave portion contacting said second heat generating element to conduct heat generated by said second heat generating element to said heat sink.

2. The supporting plate as claimed in claim 1, wherein said metal plate is a thermal conductive plate, made of stainless steel.

3. The supporting plate as claimed in claim 1, wherein said first concave portion has a deepness equal to a thickness of said thermal pad.

4. The supporting plate as claimed in claim 1, wherein shape and area of said first concave portion can accommodate said thermal pad.

5. The supporting plate as claimed in claim 1, wherein said first concave portion is formed integrated with said metal plate.

6. The supporting plate as claimed in claim 1, wherein a deepness of said second concave portion enables bottom of said second concave portion conductively attached to surface of said second heat generating element.

7. The supporting plate as claimed in claim 1, wherein said first concave portion further has an opening.

8. The supporting plate as claimed in claim 7, wherein said opening can accommodate a heat pipe of said heat sink module.

* * * * *